United States Patent
Zang et al.

(10) Patent No.: US 11,784,206 B2
(45) Date of Patent: Oct. 10, 2023

(54) PIXEL-ARRAY SUBSTRATE AND ASSOCIATED METHOD

(71) Applicant: OmniVision Technologies, Inc., Santa Clara, CA (US)

(72) Inventors: Hui Zang, San Jose, CA (US); Gang Chen, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 147 days.

(21) Appl. No.: 17/080,780

(22) Filed: Oct. 26, 2020

(65) Prior Publication Data

US 2022/0130885 A1    Apr. 28, 2022

(51) Int. Cl.
*H01L 27/146*    (2006.01)
*H01L 27/148*    (2006.01)

(52) U.S. Cl.
CPC .. *H01L 27/14643* (2013.01); *H01L 27/14603* (2013.01); *H01L 27/14605* (2013.01); *H01L 27/14607* (2013.01); *H01L 27/14614* (2013.01); *H01L 27/14638* (2013.01); *H01L 27/14812* (2013.01)

(58) Field of Classification Search
CPC ......... H01L 27/14812; H01L 27/14603; H01L 27/14614; H01L 27/14643; H01L 27/14644; H01L 27/14638; H01L 27/14607; H01L 27/14605
See application file for complete search history.

(56) References Cited

U.S. PATENT DOCUMENTS

| | | | | |
|---|---|---|---|---|
| 7,364,960 B2* | 4/2008 | Lyu | .................... | H01L 27/14689 |
| | | | | 257/E21.189 |
| 9,281,331 B2* | 3/2016 | Chen | ................... | H01L 29/4236 |
| 9,609,250 B2* | 3/2017 | Lee | ................... | H01L 27/14612 |
| 9,659,987 B2* | 5/2017 | Wang | ................ | H01L 27/14638 |
| 9,865,635 B2* | 1/2018 | Park | .................. | H01L 27/14621 |
| 10,707,253 B2* | 7/2020 | Choi | ................. | H01L 27/14627 |
| 11,404,460 B2* | 8/2022 | Chen | ................ | H01L 27/14643 |
| 11,521,997 B2* | 12/2022 | Lin | .................... | H01L 27/14643 |
| 2020/0119082 A1* | 4/2020 | Lee | ...................... | H01L 27/1463 |
| 2021/0193701 A1* | 6/2021 | Higashitsutsumi | .... | H04N 25/53 |
| 2021/0210534 A1* | 7/2021 | Chen | ................. | H01L 27/14627 |

* cited by examiner

*Primary Examiner* — David A Zarneke
(74) *Attorney, Agent, or Firm* — COZEN O'CONNOR (57) ABSTRACT

A pixel-array substrate includes a floating diffusion region and a first photodiode formed in a semiconductor substrate. A top surface of the semiconductor substrate defines a trench 1A and a trench 1B each (i) extending into the semiconductor substrate away from a planar region of the top surface between the trench 1A and the trench 1B and (ii) having a respective distal end, with respect to the floating diffusion region, located between the floating diffusion region and the first photodiode. In a horizontal plane parallel to the top surface and along an inter-trench direction between the trench 1A and the trench 1B, a first spatial separation between the trench 1A and the trench 1B increases with increasing distance from the floating diffusion region.

22 Claims, 7 Drawing Sheets

PIXEL-ARRAY SUBSTRATE AND ASSOCIATED METHOD

BACKGROUND

Camera modules in commercial products such as stand-alone digital cameras, mobile devices, automotive components, and medical devices include an image sensor and a pixel array thereof. The pixel array includes a plurality of pixels. A pixel array's pixel density is the number of pixels per unit area on the image sensor. In operation, the lens of a camera module forms an image, on the image sensor, of an object in its field of view. The object can be viewed as a plurality of infinitesimally small point-sources of illumination—"impulses"—incident on the camera. The lens images each of the plurality of impulses at a plane of the pixel array as a respective one of a plurality of point-spread functions—"impulse responses." The resolution of images captured by the image sensor depends in part on pixel size compared to the size of the impulse response. Accordingly, one way to increase a camera's maximum attainable resolution is to increase pixel density by decreasing pixel size. Motivation to decrease pixel sizes has led to development of pixels with vertical transfer gates.

Each pixel of the plurality of pixels includes a photodiode, a floating diffusion region, and a transfer gate. The transfer gate controls electron flow from the photodiode to the floating diffusion region and may be part of a field-effect transistor. Light reaching the photodiode generates photoelectrons. Turning on the transfer gate forms a conducting channel that allows the accumulated photoelectrons to transfer or flow from the photodiode to the floating diffusion region. When the transfer gate is pulsed to an off-state, the associated potential is lower than that of the photodiode raising a barrier in the corresponding energy band diagram to block electron flow from photodiode to floating diffusion region, hence preventing photoelectrons from flowing to the floating diffusion region.

In one common pixel architecture, the photodiode and the floating diffusion region are laterally displaced within the pixel, in a lateral direction parallel to a plane of the pixel array, with the transfer gate therebetween. This plane is horizontally orientated with respect to the vertical direction perpendicular thereto that defines the direction of normally-incident light (illumination) reaching the pixel array. Such a horizontal orientation limits how much the pixel density can be increased. Hence, one way to increase pixel density is to orient the photodiode, transfer gate, and floating diffusion region in a direction that has a vertical component. Such transfer gates are examples of vertical transfer gates.

SUMMARY OF THE EMBODIMENTS

When the vertical transfer gate is on and the floating diffusion region is close to its electron-storage capacity, potential differences between the photodiode and the floating diffusion region become sufficiently small, and back injection of charges from the floating diffusion region to the photodiode occurs. This charge back injection phenomenon can result in image artifacts, especially when conversion gain is high. Embodiments disclosed herein remedy this problem.

In a first aspect, a pixel-array substrate includes a floating diffusion region and a first photodiode formed in a semiconductor substrate. A top surface of the semiconductor substrate defines a trench 1A and a trench 1B each (i) extending into the semiconductor substrate away from a planar region of the top surface between the trench 1A and the trench 1B and (ii) having a respective distal end, with respect to the floating diffusion region, located between the floating diffusion region and the first photodiode. In a horizontal plane parallel to the top surface and along an inter-trench direction between the trench 1A and the trench 1B, a first spatial separation between the trench 1A and the trench 1B increases with increasing distance from the floating diffusion region.

In a second aspect, a pixel cell of a pixel array in an image sensor includes a plurality of photodiodes formed in a semiconductor substrate, a floating diffusion region formed in the semiconductor substrate, and a plurality of transfer gates. Each of the plurality of transfer gates (i) is located on a surface of the semiconductor substrate and, (ii) couples a respective one of the plurality of photodiodes to the floating diffusion region, and (iii) includes a planar gate, a first vertical gate, and a second vertical gate not parallel to the first vertical gate in a plane parallel to the surface. Each of the first vertical gate and the second vertical gate extends from the planar gate into the semiconductor substrate. The first vertical gate and the second vertical gate are proximate to the respective one of the plurality of photodiodes.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1:
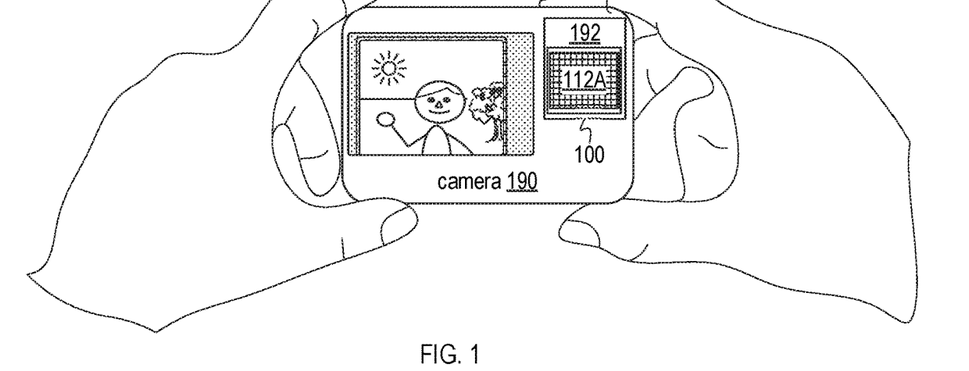
FIG. 1 depicts a camera imaging a scene.

FIG. 1 depicts a camera 190 imaging a scene. Camera 190 includes an image sensor 192, which includes a pixel-array substrate 100. Constituent elements of pixel-array substrate 100 may include at least one of silicon and germanium. Pixel-array substrate 100 includes a pixel array 112A. Image sensor 192 may part of a chip-scale package or a chip-on-board package.

Figure 2:
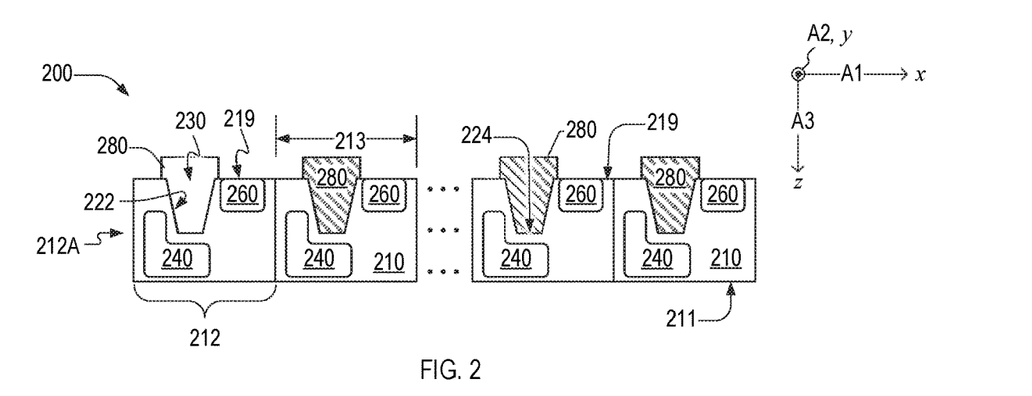
FIG. 2 is a cross-sectional schematic of a pixel-array substrate, which is an embodiment of the pixel-array substrate of the camera of FIG. 1.

FIG. 2 is a cross-sectional schematic of a pixel-array substrate 200, which is an example of pixel-array substrate 100 of image sensor 192. The cross-section illustrated in FIG. 2 is parallel to a plane, hereinafter the x-z plane, formed by orthogonal axes A1 and A3, which are each orthogonal to an axis A2. Herein, the x-y plane is formed by orthogonal axes A1 and A2, and planes parallel to the x-y plane are referred to as transverse planes. Unless otherwise specified, heights of objects herein refer to the object's extent along axis A3. Herein, a reference to an axis x, y, or z refers to axes A1, A2, and A3 respectively. Also, herein, a horizontal plane is parallel to the x-y plane, a width refers to an object's extent along the y axis, and a vertical direction is along the z axis.

Pixel-array substrate 200 includes a semiconductor substrate 210, which has a bottom substrate surface 211 and a top substrate surface 219, each of which may be perpendicular to direction A3. Herein, top substrate surface 219 may be referred to as the front side surface of semiconductor substrate 210 and bottom substrate surface 211 may be referred to as the backside surface of semiconductor substrate 210. Herein, top substrate surface 219 may be referred as the non-illuminated surface of semiconductor substrate 210 and bottom substrate surface 211 opposite to top substrate surface 219 may be referred to as the illuminated surface of semiconductor substrate 210. Semiconductor substrate 210 includes a plurality of pixel cells and each pixel cell includes a plurality of pixels 212 that form a pixel array 212A, which is an example of pixel array 112A.

Figure 3:
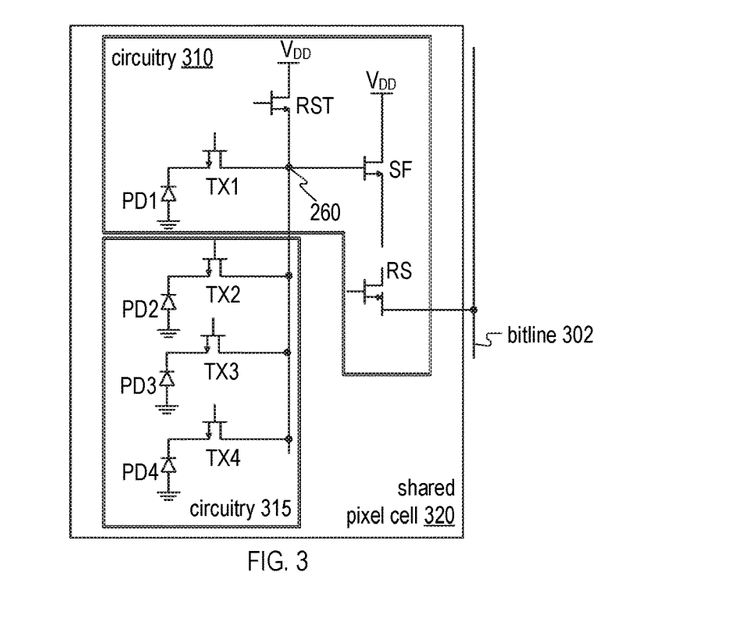
FIG. 3 is a circuit diagram of a four-transistor ("4T") pixel, which is a candidate pixel circuitry architecture of a pixel of FIG. 2.

FIG. 3 is a circuit diagram of a four-transistor ("4T") circuitry 310, which is a candidate pixel circuitry architecture of pixel 212. Pixel circuitry 310 includes a photodiode PD1, a transfer transistor TX1, a reset transistor RST, a source follower transistor SF, a row-select transistor RS. Circuitry 310 is electrically connected to a bitline 302 of image sensor 192. FIGS. 2 and 3 are best viewed together in the following description.

In embodiments, each pixel 212 is one of multiple pixels of a shared pixel cell. FIG. 3 depicts a pixel-cell circuitry 320, which is candidate pixel circuitry architecture for the shared pixel cell. Pixel-cell circuitry 320 includes circuitry 310 and circuitry 315. Circuitry 315 includes additional respective photodiodes PD2-PD4 and transfer transistors TX2-TX4 of three additional pixels of the shared pixel cell. Pixel circuitry 315 and circuitry 310 represent pixel circuitry for a shared pixel cell 320. Herein, transfer transistor TX refers to one of transfer transistors TX1-TX4.

Each pixel 212 includes a respective photodiode 240, a respective transfer transistor (e.g., transfer transistor TX) having a vertical transfer gate 280, and a respective floating diffusion region 260. Photodiode 240 of each pixel 212 is at least partially buried in pixel-array substrate 200 and is configured to generate and accumulate charges in response to incident light (illumination) thereon, for example entered from bottom substrate surface 211 of semiconductor substrate 210 (e.g., backside surface of semiconductor substrate 210) during an integration period of the image sensor 192. Photodiode 240 is an example of any one of photodiodes PD1-PD4 of FIG. 3.

Electrical connection of photodiode 240 (e.g., one of photodiodes PD1-PD4) to floating diffusion region 260 depends on voltage applied to a transfer gate (e.g., vertical transfer gate 280) of the respective transfer transistor (e.g., transfer transistor TX) associated with pixel 212. Charges, e.g., photoelectrons, accumulated in photodiode 240 (e.g., source of transfer transistor TX) of respective pixel 212, for example during an integration period of image sensor 192, can be selectively transferred to floating diffusion region 260 (e.g., drain of transfer transistor TX) depending on voltage applied to the transfer gate (e.g., vertical transfer gate 280) of the respective transfer transistor (e.g., transfer transistor TX) associated with pixel 212, for example during a subsequent charge transfer period. The photodiode 240 may be in form of various configurations including pinned photodiode configuration, partially pinned photodiode configuration.

Transfer gate (e.g., vertical transfer gates 280) of each transfer transistor (e.g., vertical gate electrodes of transfer transistor TX1) is formed in a respective trench 230 defined by a side trench-surface 222 and a bottom trench-surface 224 of top substrate surface 219.

In embodiments, each pixel 212 is a pixel unit in a shared pixel cell and each pixel cell further includes a reset transistor RST, a source follower transistor SF, and a row-select transistor RS shared by pixel 212 in the shared pixel cell. Reset transistor RST is coupled between a power line and floating diffusion region 260 to reset (e.g., discharge or charge floating diffusion region 260 to a preset voltage e.g., a supply voltage $V_{DD}$) under control of a reset signal during a reset period. Reset transistor RST is further coupled to photodiode 240 (e.g., one of photodiodes PD1-PD4) through the respective transfer transistor TX (e.g., transfer transistor TX1-TX4) to reset photodiode 240 to the preset voltage during the reset period. Floating diffusion region 260 is coupled to a gate of source follower transistor SF. The source follower transistor SF is coupled between the power line and row-select transistor RS. Source follower transistor SF operates to modulate the image signal output based on the voltage of floating diffusion region 260 received, where the image signal corresponds to the amount photoelectrons accumulated in photodiode 240 of each pixel during the integration period at the gate thereof. The row-select transistor RS selectively couples the output (e.g., image signal) of the source follower transistor RS to the readout column line (for example, bitline 302) under control of a row select signal.

In operation, during the integration period (also referred to as an exposure or accumulation period) of image sensor 192, photodiode 240 detects or absorbs light incident on pixel 212 and photogenerates charge. During the integration period, each of the transfer transistors TX1-TX4 is turned off, i.e., the vertical transfer gate 280 of the respective transfer transistor TX1-TX4 receives a cut-off signal (e.g., a negative biasing voltage). The photogenerated charge accumulated in photodiode 240 is indicative of the amount of light incident on photodiode 240. After the integration period, each of the transfer transistors TX1-TX4 is turned on forming a conduction channel along the vertical transfer gate structure and transfers the photogenerated charge from photodiode 240 to floating diffusion region 260 through the conduction channel upon reception of a transfer signal (e.g., a positive biasing voltage) at vertical transfer gate 280 of transfer transistors TX1-TX4. The source follower transistor SF generates the image signal. The row-select transistor RS coupled to the source follower transistor then selectively reads out the signal onto a column bit line for subsequent image processing.

The disclosed vertical transfer gate structure is applied to a shared type pixel cell where the floating diffusion region is shared by multiple photodiodes, but may also apply to any of a variety of additional or alternative types of pixel cell, e.g. a four-transistor pixel cell, five-transistor pixel cell, or a six-transistor pixel cell.

Figure 4:
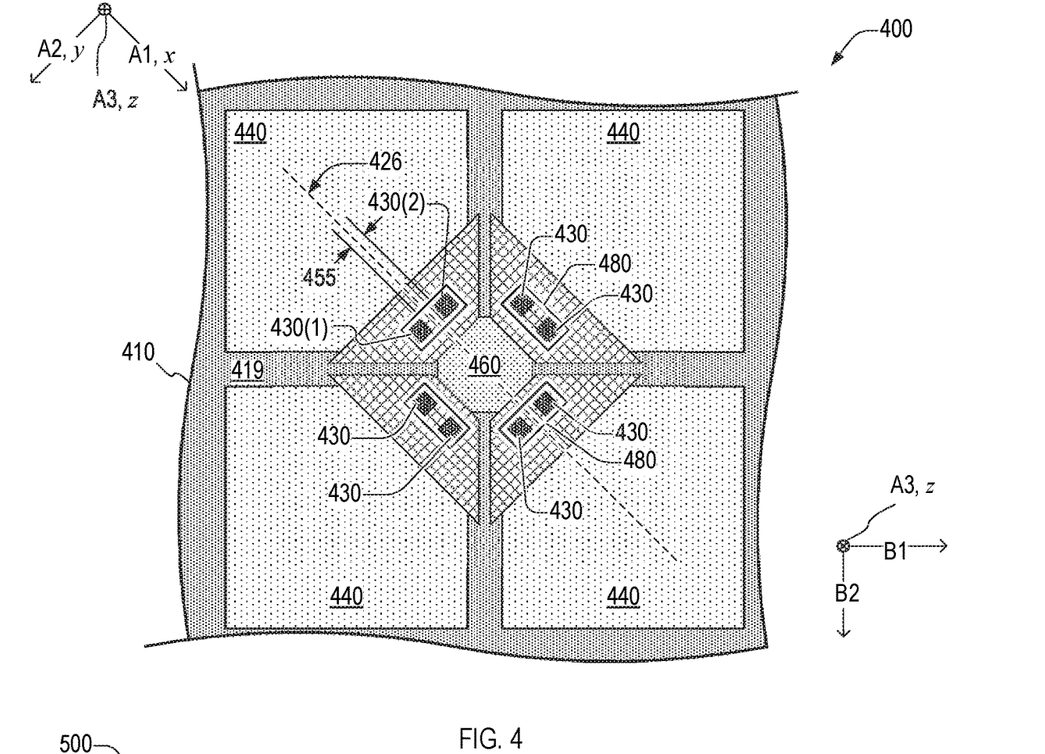
FIG. 4 is a cross-sectional schematic of a pixel-array substrate, which is an example of the pixel-array substrate of FIG. 2.

FIG. 4 is a cross-sectional schematic of a pixel-array substrate 400, which is an example of pixel-array substrate 200, FIG. 2. FIG. 4 illustrated a shared pixel cell where multiple photodiodes, e.g., four photodiodes share a common floating diffusion region. Restated, each of photodiode in the shared pixel cell transfer photo-generated charges to the floating diffusion region. Pixel-array substrate 400 includes a semiconductor substrate 410 that includes trenches 430, multiple photodiodes 440, and floating diffusion regions 460, which are examples of semiconductor substrate 210, trenches 230, photodiodes 240, and floating diffusion region 260, respectively for a shared pixel cell type. Semiconductor substrate 410 has a top surface (or top substrate surface) 419, which is an example of top substrate surface 219. Trenches 430 include a pair of parallel trenches 430(1) and 430(2) separated by a constant distance 455 on top surface 419. FIG. 4 denotes a symmetry plane 426 that is perpendicular to the x-y plane and between trenches 430(1) and 430(2). Trenches 430(1) and 430(2) are symmetric with respect to plane 426.

Each pair of adjacent trenches 430 is part of a respective transfer gate 480 denoted by a respective square around each trench 430. For clarity of illustration, not all transfer gates 480 are labeled with a reference numeral in FIG. 4. Each of transfer gates 480 includes a planar transfer gate on top surface 419 and two vertical gate electrodes. Each vertical gate electrode extends, in the z direction, from the planar transfer gate a depth from the planar transfer gate into semiconductor substrate 410. Each of the vertical gate electrodes is formed in respective trenches 430 and the pair of vertical gate electrodes of respective transfer gate is separated by the constant distance 455.

In embodiments, an implant isolation well is disposed in the semiconductor substrate between adjacent photodiodes 440, for example by implanting dopant having opposite conductive type to photodiodes, to electrically isolate adjacent photodiodes 440.

Figure 5:
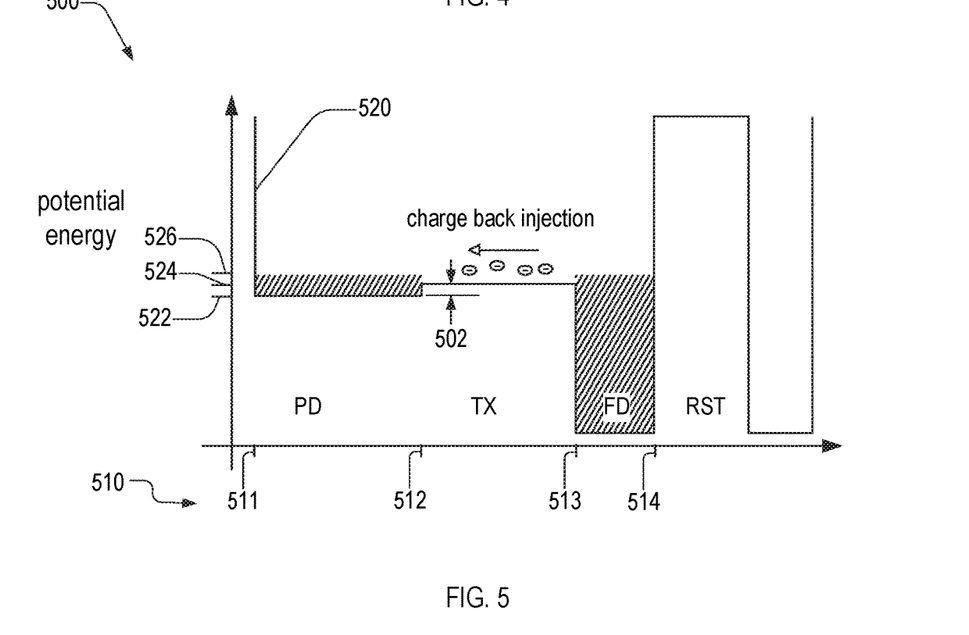
FIG. 5 is an energy band diagram illustrating potential energy transition within the pixel-array substrate of FIG. 4, in an embodiment.

FIG. 5 is a potential band diagram 500 of potential energy 520 as a function of positions 510 along a direction in symmetry plane 426 perpendicular to the x-y plane and within semiconductor substrate 410. Photodiode 440 is between positions 511 and 512. Positions 512 and 513 denote location of transfer channel region in semiconductor substrate 410 between respective photodiode 440 and floating diffusion region 450. Floating diffusion region 460 is between positions 513 and 514. In operation, potential energy level of transfer channel region depicted by 520 is constant (e.g., with zero slope) between positions 512 and 513 because distance 455 is constant. FIG. 5 denotes this potential energy level associated with transfer channel region as potential 524, the potential energy level in photodiode 440 as potential energy level 522, and a potential difference between potentials 522 and 524 as potential energy difference 502. Potential energy level associated with photodiode 440 may correspond to pinning voltage $V_{pin}$ of photodiode upon accumulating photo-generated charge.

The highest potential energy level of floating diffusion region 460 is denoted as potential energy level 526. When floating diffusion region 460 is close to its electron-storage capacity during charge transfer, differences between potential energy level 526, 522, and 524 in the energy band diagram are sufficiently small that the electric field between photodiode 440 and diffusion region 460 is no longer large enough to transfer sufficient charge therebetween and photo-generated charge may flow backward from floating diffusion region 460 through transfer channel region formed of transfer gate 480 to photodiode 440 refer as back injection phenomenon of charges. Consequently, pulsing transfer gate 480 does not completely deplete photodiode 440 of collected charge i.e., insufficient or incomplete charge transfer, which results in image lag that manifests as black dots in images produced by camera 190.

Figure 6:
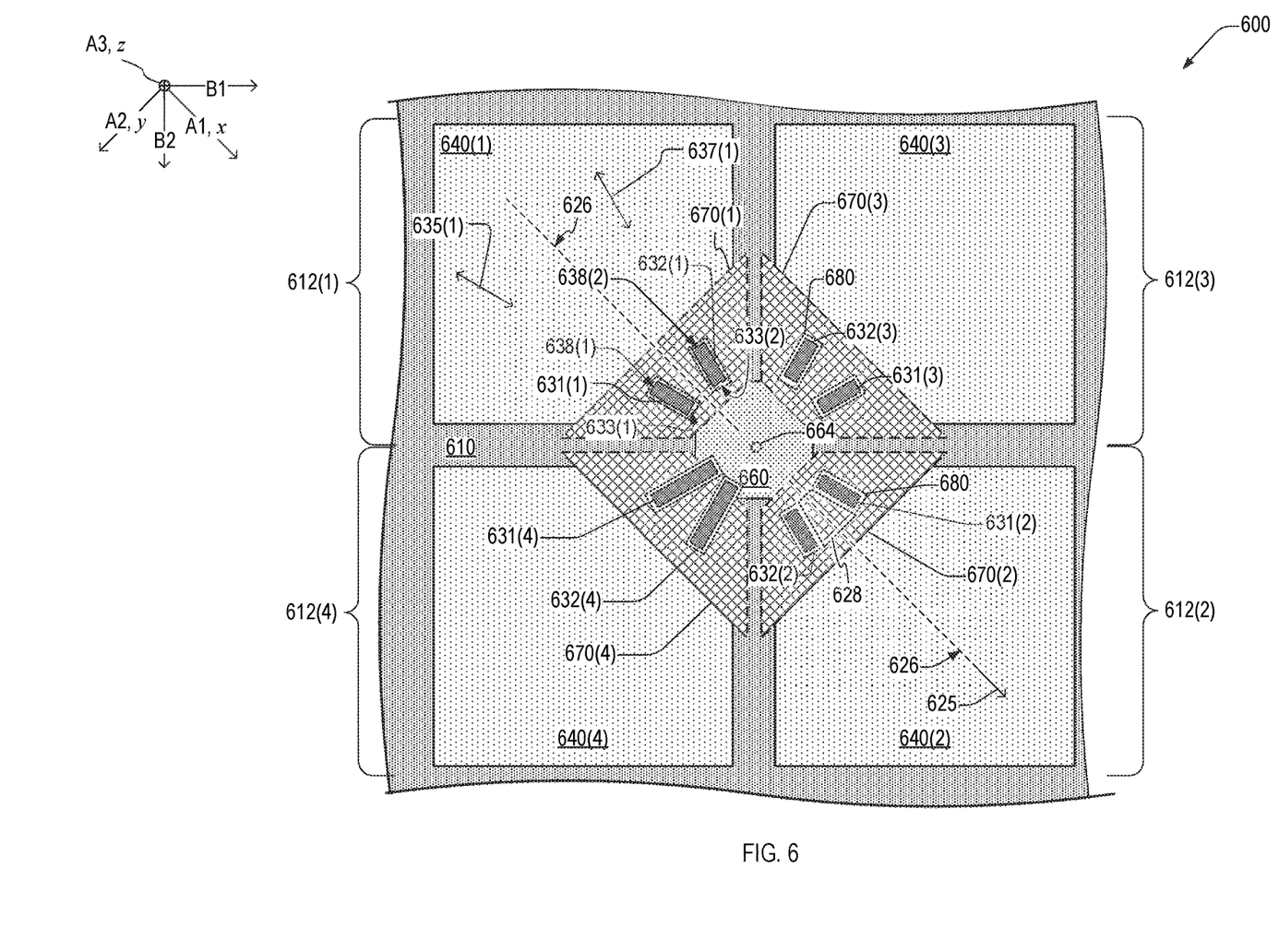
FIGS. 6-8 are respective views of a pixel-array substrate, which is an example of the pixel-array substrate of FIG. 2.
Figure 7:
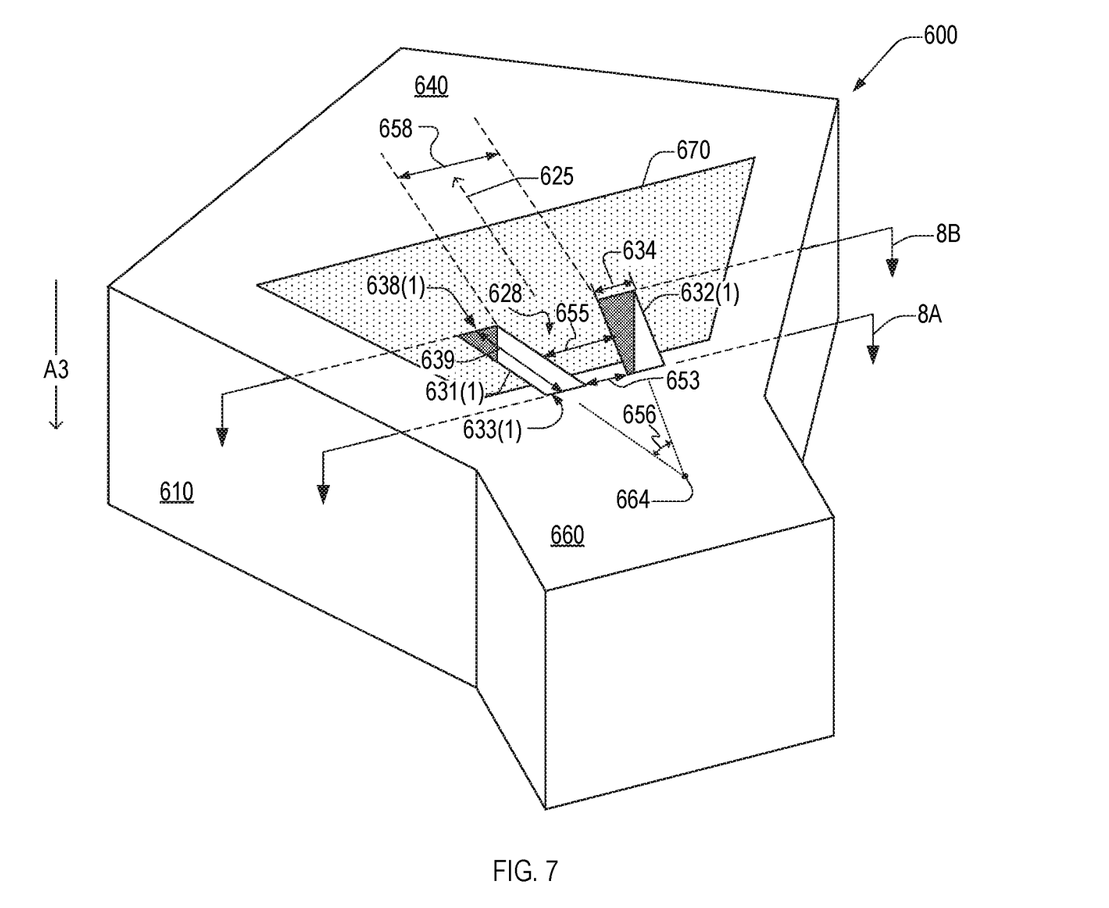
Figure 8:
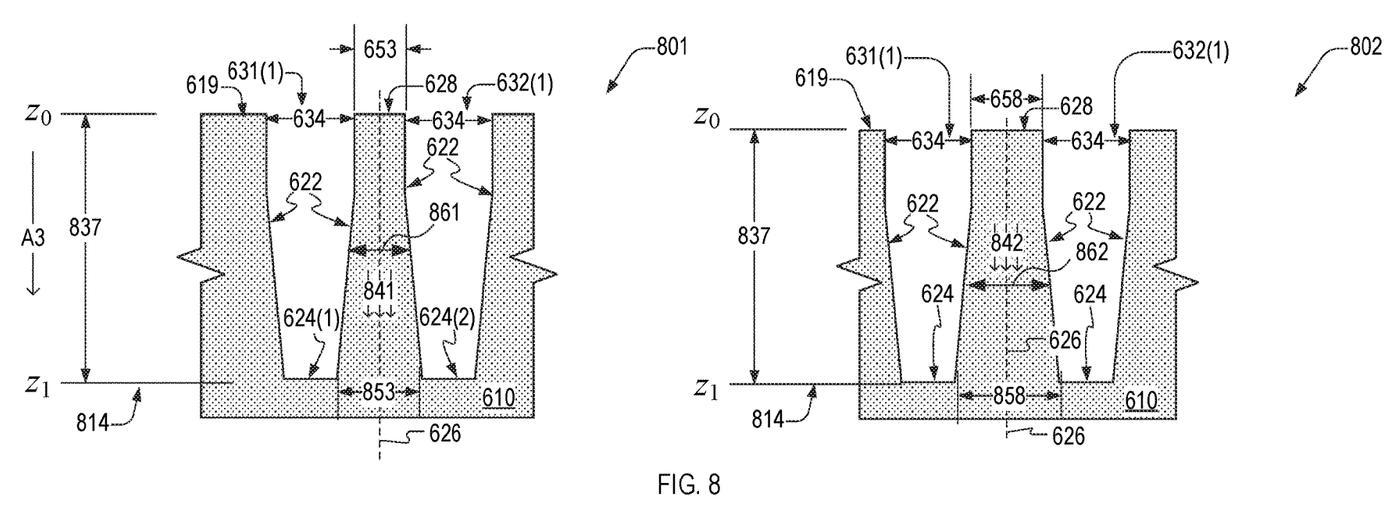

FIG. 6 is a cross-sectional schematic of a pixel-array substrate 600 having pixel with dual vertical transfer gate structure, hereinafter pixel-array substrate 600. Pixel-array substrate 600 is an example of pixel-array substrate 200, FIG. 2. Pixel-array substrate 600 has a plurality of pixel cells formed thereon, where FIG. 6 is an illustration of one pixel cell. FIG. 7 is an isometric view of part of pixel-array substrate 600. FIG. 7 denotes cross-sectional planes 8A and 8B. FIG. 8 depicts cross-sectional views 801 and 802 of pixel-array substrate 600 in cross-sectional planes 8A and 8B respectively. FIGS. 6-8 are best viewed together in the following description.

Pixel-array substrate 600 includes a semiconductor substrate 610, which is an example of semiconductor substrate 210. Semiconductor substrate 610 includes a plurality of photodiodes 640 and a floating diffusion region 660, which are respective examples of photodiode 240 and a floating diffusion region 260.

Semiconductor substrate 610 has a top surface (or top substrate surface) 619 that defines a trench 631(1) and a trench 632(1). Specifically, each trench 631 and 632 is defined by a respective side trench-surface 622 and a respective bottom trench-surface 624 of surface 619. FIG. 8 denotes a trench-bottom plane 814 that intersects bottom trench surfaces 624. Surfaces 622 and 624 are examples of surfaces 222 and 224, respectively.

Pixel-array substrate 600 remedies deficiencies of pixel-array substrate 400 because adjacent trenches 631 and 632 diverge with increasing distance from floating diffusion region 660. Hence, when vertical transfer gates formed in trenches 631 and 632 are held at a constant potential energy level, the potential energy between adjacent trenches is sloped between photodiode 640 and floating diffusion region 660, which creates an electric field that increases current flow thereto and thus reduces the likelihood of charge back-injection and associated image artifacts.

In embodiments, pixel-array substrate 600 also includes at least one of (i) photodiode 640(2) and trenches 631(2) and 632(2), (ii) photodiode 640(3) and trenches 631(3) and 632(3), and (iii) photodiode 640(4) and trenches 631(4) and 632(4). Floating diffusion region 660 is located between the first photodiodes 640(1) and 640(2), and also between photodiodes 640(3) and 640(4). In embodiments, each trench 631 and 632 is part of a respective transfer gate 680 denoted by a respective rectangle around each trench 631 and 632. When switched on, each transfer gate 680 is electrically couples a respective photodiode 640 to floating diffusion region 660 for controlling charge transfer operation between the respective photodiode 640 and the floating diffusion region 660. In embodiments, pixel-array substrate 600 includes a planar gate-electrode on surface 619 that electrically connects vertical gate-electrodes that fill respective adjacent trenches 631 and 632. In such embodiments, transfer gate 680 includes the planar gate electrode and the two vertical gate-electrodes that fill adjacent trenches 631 and 632.

Photodiode 640(1)-640(4) may be grouped in a pixel cell. The pixel cell illustrated in FIG. 6 is configured as shared pixel cell and where multiple photodiodes 640(1)-640 (4) are coupled to a common floating diffusion region 660 and a common read out circuitry including a common source follower, a common reset transistor, and a common row select transistor. For clarity of illustration, not all transfer gates 680 are labeled with a reference numeral in FIG. 6.

In embodiments, pixel-array substrate 600 includes a plurality of pixel cells arranged in an array form and each pixel cell includes pixels 612(k), where k is a positive integer less than or equal to four. It is appreciated in other embodiments k may be greater four depending on pixel cell configuration. Pixels 612(k) form one of the two-by-two pixel cell. Each pixel 612(k) includes photodiode 640(k), trench 631(k), trench 632(k), and floating diffusion region 660, which is common to each of pixels 612(1-4).

Pixels 612 are arranged in as a pixel array including a plurality of rows and columns along axes B1 and B2 respectively. In embodiments, pixel pitch of the pixel array is less than 1.1 μm, for example, the pixel pitch may be between 0.6 micrometers and 3.0 micrometers In embodiments, transfer gate 680 associated with respective pixel 612 includes a respective planar transfer gate 670 and vertical transfer gates disposed in the trenches 631, 632, respectively. Vertical transfer gates are arranged to extend from the respective planar transfer gate 670 a depth into the semiconductor substrate 610. In one embodiment, planar transfer gate 670 covers respective vertical transfer gates entirely. In one embodiment, planar transfer gate 670 covers the respective vertical transfer gates partially. Pixel 612 is an example of pixel 212, FIG. 2.

Herein, an element in the figures denoted by a reference numeral suffixed by a parenthetical numeral is an example of the element indicated by the reference numeral. For example, each photodiode 640(1, 2, ... N) is a respective example of photodiode 640, and each trench 632(1, 2, ..., N) is a respective example of the trench 632. Accordingly, and unless otherwise specified, a relationship between two elements with a suffix (m) also applies for those two elements with suffix (n≠m), where m and n are positive integers. While the following description refers to elements with parenthetical numeral (1), it may also apply to at least one of parenthetical numerals (2), (3), and (4). Attributes ascribed to pixel 612(1) or any elements thereof may also be respectively ascribed to one or more pixels 612(2-4) and any elements thereof.

Each trench 631 and 632 extends into semiconductor substrate 610 away from a planar region 628 of top surface 619 between trench 631(1) and trench 632(1). Each of trench 631(1) and trench 632(1) has a depth 837 between planar region 628 and plane 814, as shown in FIG. 8. In embodiments, depth 837 is between 0.3 micrometers and 0.6 micrometers.

FIG. 6 denotes an inter-trench direction 625 and an inter-trench plane 626 that includes inter-trench axis 625. Inter-trench axis 625 is parallel to axes A1. Inter-trench axis 625 is between trenches 631(1) and 632(1). Inter-trench plane 626 is perpendicular to planar region 628. In embodiments, inter-trench plane 626 is a symmetry plane between trenches 631(1) and 632(1), such that trenches 631(1) and 632(1) are mirror symmetric about inter-trench plane 626.

In a horizontal plane that includes planar region 628 and along inter-trench axis 625, trenches 631(1) and 632(1) are separated by a distance 655, herein also referred to as $h_T(x)$. Distance 655 increases with increasing distance from floating diffusion region 660 along inter-trench axis 625 such that length-wise orientations of trenches 631(1) and 632(1) are not parallel, as illustrated by a non-zero angle 656. In embodiments, angle 656 is between ten degrees and thirty degrees. This range of angles achieves the aforementioned benefit of the sloped potential energy while avoiding trenches 631 and 632 from joining at respective proximal ends 633 illustrated in FIG. 6.

With respect to floating diffusion region 660, each of trenches 631 and 632 has a respective distal end 638 and a respective proximal end 633. Each distal end 638 is located proximate to the respective photodiode 640(1) and away from floating diffusion region 660. Each proximal end 633 is located proximate to the floating diffusion region 660 and away from the respective photodiode 640(1). At proximal ends 633, the lateral spacing between the pair of trenches 631 and 632 (distance 655) equals a top proximal distance 653. At distal ends 638, distance 655 equals a top distal distance 658 that exceeds top proximal distance 653. In embodiments, top proximal distance 653 ranges from 0.03 micrometers to 0.10 micrometers. In embodiments, top distal distance 658 ranges from 0.12 micrometers to 0.30 micrometers. When top distal distance 658 exceeds 0.3 micrometers, dual vertical transfers gates formed in adjacent trenches 631 can no longer couple, such that the benefit of the double vertical-transfer-gate structure is not realized.

In embodiments, each of proximal ends 633(1) and 633(2) is located between floating diffusion region 660 and photodiode 640(1). In embodiments, at least one trench 631 and at least one trench 632 laterally extends into floating diffusion region 660, such that at least one proximal end is located in floating diffusion region 660. In some embodiments, at least one pair of trenches 631, 632 of a respective transfer gate is extended into and surrounded by floating diffusion region 660 on a least three sides. For example, FIG. 6 illustrates each of trenches 631(4) and 632(4) extending into floating diffusion region 660. Restated, respective proximal ends 633 of trenches 631(4) and 632(4) are surrounded by floating diffusion region 660. Accordingly, each vertical transfer gate of the respective transfer gate 680 disposed in respective trenches 631(4) and trench 632(4) has one end (e.g., the proximal end 633) surrounded by floating diffusion region 660 in the horizontal plane. Extending trenches 631 and 632 into diffusion region 660 increases the slope of the potential energy associated with transfer channel region between photodiode 640 and floating diffusion region 660, and thus facilitates charge transfer from respective photodiode to floating diffusion region 660 and reduces the likelihood of charge back-injection and associated image artifacts.

In a plane that includes planar region 628, each trench 631 and 632 has a length 639 and, at one or both of proximal end 633 and distal end 638, a trench width 634. In embodiments, width 634 is between 0.05 micrometers and 0.15 micrometers. In embodiments, length 639 is between 0.1 micrometers and 0.5 micrometers. In embodiments, length 639 exceeds trench width 634.

In embodiments, trench 631(1) and trench 632(1) are oblong in respective directions 635(1) and 637(1) that intersects at a point 664 within floating diffusion region 660. Directions 635(1) and 637(1) are not parallel, rather, the angle therebetween is angle 656 illustrated in FIG. 7. Trench 631 (1) and trench 632(1) are not parallel to each other. Hence, the pair of vertical transfer gate of transfer gate 680 disposed in respective trenches 631(1) and trench 632 (2) are not parallel to each other. In embodiments, point 664 is at a geometric center of floating diffusion region 660 in a plane that includes planar region 628.

In trench-bottom plane 814 and cross-sectional plane 8A trenches 631(1) and 632(1) are separated by bottom proximal distance 853. In embodiments, bottom proximal distance 853 equals top inter-gate top proximal distance 653. In embodiments, bottom proximal distance 853 exceeds top inter-gate top proximal distance 653, as shown in cross-sectional views 801 of FIG. 8.

In trench-bottom plane 814 and cross-sectional plane 8B trenches 631(1) and 632(1) are separated by bottom distal distance 858. In embodiments, bottom distal distance 853 equals top distal distance 658. In embodiments, bottom distal distance 858 exceeds top distal distance 658, as shown in cross-sectional views 802 of FIG. 8. In embodiments, bottom distal distance 858 is the same as top distal distance 658.

Cross-sectional view 801 (cross-sectional planes 8A of FIG. 7) denotes a distance 861, herein also $d_1(z)$, between trenches 631(1) and 632(2) between planar region 628 and plane 814, where z equals $z_0$ at planar region 628, z equals $z_1$ at plane 814. Depth 837 equals ($z_1-z_0$) and $z_1$ is greater than $z_0$ with respect to the top surface 619. In cross-sectional plane 8A, distance $d_1(z)$ ranges from top proximal distance 653 at planar region 628 to distance 853 at plane 814. In embodiments, distance $d_1(z)$ is a non-decreasing function (of increasing z) between planar region 628 ($z=z_0$) and plane 814 ($z=z_1$). In embodiments, distance $d_1(z)$ is a monotonically increasing function between planar region 628 and plane 814. In embodiments, trench width 634 of each trenches 631(1) and 632(2) decreases as depth in semiconductor substrate 610 increases, i.e., trench width 634 is a decreasing function (of increasing z) between planar region 628 ($z=z_0$) and plane 814 ($z=z_1$).

Cross-sectional view 802 (cross-sectional planes 8B of FIG. 7) denotes a distance 862, herein also $d_2(z)$, between trenches 631(1) and 632(2) between planar region 628 and plane 814. In cross-sectional plane 8B, distance $d_2(z)$ ranges from top distal distance 658 at planar region 628 to distance 858 at plane 814. In embodiments, distance $d_2(z)$ is a non-decreasing function (of increasing z) between planar region 628 ($z=z_0$) and plane 814 ($z=z_1$). In embodiments, distance $d_2(z)$ is a monotonically increasing function between planar region 628 and plane 814. In embodiments, top proximal distance 653 at planar region 628 is less than bottom distal distance 658, and bottom proximal distance 853 at plane 814 is less than bottom distal distance 858.

Distances 861 ($d_1(z)$) and 862 ($d_2(z)$) being non-decreasing functions as described above means that when vertical transfer gates formed in trenches 631 and 632 are held at a constant potential energy level by receiving a biasing voltage, the potential energy in inter-trench plane 626 is sloped between plane 814 and planar region 628. This sloped potential energy corresponds to vertical electric fields 841 and 842, which increases electron flow from photodiode 640 to planar region 628, and thus also to floating diffusion region 660.

In embodiments, the smaller the distance 653 between vertical transfer gates disposed in respective trenches 631(1) and 632(2) at planar region 628, the steeper or larger the slope (decreasing slope) in potential energy of transfer channel region formed between respective photodiode 640 and floating diffusion region 660 toward floating diffusion region 660, thus facilitating charge transfer from respective photodiode 640 to floating diffusion region 660 and preventing charge back injection from occurring.

Figure 9:
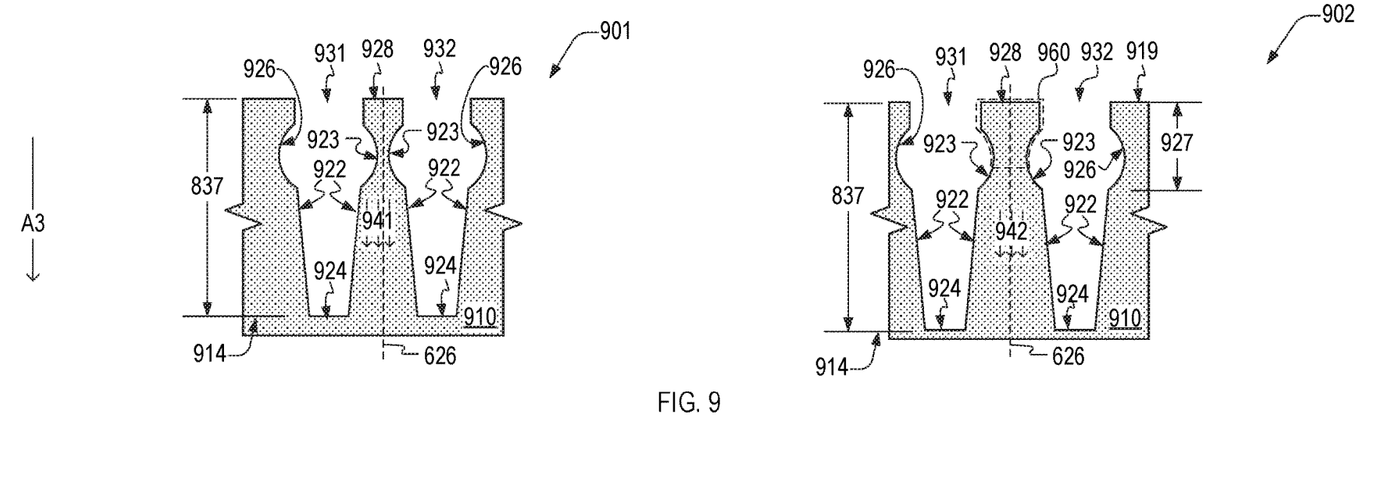
FIG. 9 includes cross-sectional views of a semiconductor substrate, which is an example of a semiconductor substrate of FIGS. 6-8.

FIG. 9 depicts cross-sectional views 901 and 902 of a semiconductor substrate 910 in cross-sectional planes 8A and 8B respectively. Semiconductor substrate 910 is an example of semiconductor substrate 610 and has a top surface (or top substrate surface) 919 that defines trench trenches 931 and 932, which are respective examples of trenches 631 and 632. Top surface 919 includes a planar region 928 between trenches 931 and 932. Planar region 928 is an example of planar region 628. Each trench 931 and 932 is defined by a respective side trench-surface 922(1, 2) and a respective bottom trench-surface 924 of top surface 919. Surfaces 922 and 924 are respective examples of surfaces 622 and 624. Top surface 919 includes a planar region 928 between trenches 931 and 932.

In trench-bottom plane 914 and cross-sectional plane 9A trenches 931(1) and 932(1) are separated by bottom proximal distance 853. In trench-bottom plane 914 and cross-sectional plane 9B, trenches 931(1) and 932(1) are separated by bottom distal distance 858. At least one of side trench-surfaces 922(1, 2) includes an inner concave region 923. At least one of side trench surfaces 922(1, 2) may also include an outer concave region 926. Concave regions 923 and 926 add degrees of freedom for tailoring the potential energy diagram in the vertical direction in inter-trench plane 626, and hence also increase electric fields 941 and 942 in upward direction to facilitate charge transfer upon respective vertical transfer gate receive a biasing voltage, which are examples of electric fields 841 and 842, respectively.

In embodiments, a floating diffusion region 960 is implanted to at least partially overlap with inner concave region 923 and outer concave region 926. Concave regions 923 and 926 extend to a depth 927 with respect to planar region 928. In embodiments, a junction depth of floating diffusion region 960) in the semiconductor substrate 910 is at least half of depth 927. Floating diffusion region 960 is an example of floating diffusion region 660.

Figure 10:
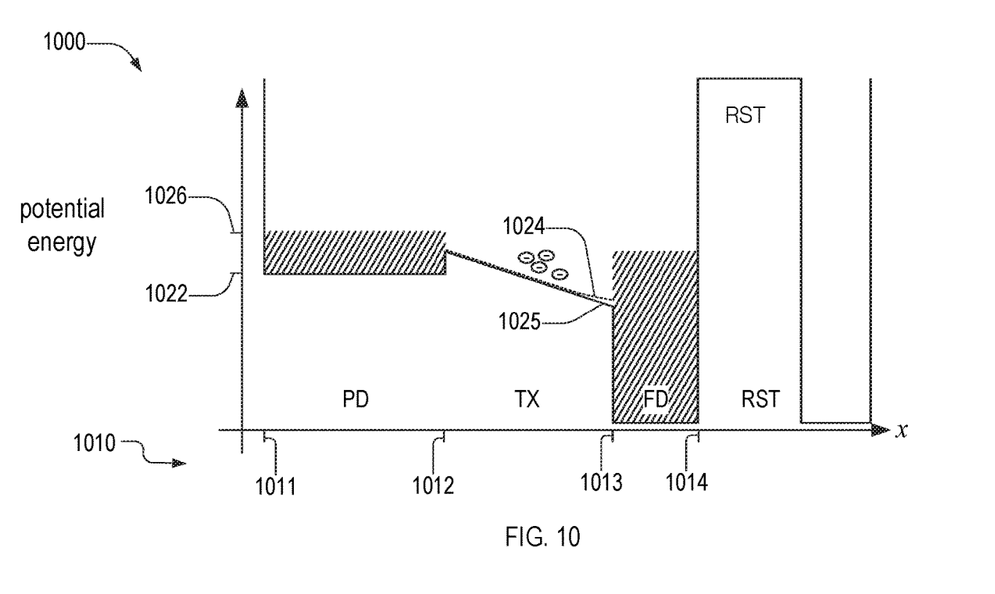
FIG. 10 is an energy band diagram illustrating potential energy transition within the pixel-array substrate of FIGS. 6-8, in an embodiment.

FIG. 10 is a potential energy diagram 1000 of potential energy as a function of positions 1010 along direction x in inter-trench plane 626, parallel to the x-y plane, and within semiconductor substrate 610 when transfer gates 680 have a voltage applied thereto. Photodiode 640 is between positions 1011 and 1012. Positions 1012 and 1013 denote location of transfer channel region in semiconductor substrate 610 formed by transfer gate 680 upon biasing between photodiode 640 and floating diffusion region 660. Floating diffusion region 660 is between positions 1013 and 1014. In operation, potential energy level decreases between positions 1012 and 1013 distance 655 decreases between photodiode 640 and floating diffusion region 660 facilitating charge transfer while preventing charge injection. The decreasing change of potential energy level associated with the transfer channel region between positions 1012 and 1013 is related to top proximal distance 653 between trenches 631 and 632. In embodiments, the decreasing rate of potential energy associated with the transfer channel region between positions 1012 and 1013 is related to an angle included between trenches 631 and 632. The smaller the top proximal distance 653 or the larger the angle between the two trenches 631 and 632, electric field generated by between the respective vertical transfer gates form the transfer channel region having a potential energy gradient with larger slope, which facilitates charge transfer between photodiode 640 and floating diffusion region 660. FIG. 10 denotes this potential energy as gradient potential energy 1024, and denotes the potential energy in photodiode 640 as potential energy 1022 that is higher than the potential energy of floating diffusion region 660. The gradient potential energy 1024 has a slope that corresponds to the top proximal distance 653 between the two trenches 631 and 632. When trenches 631 and 632 extend into floating diffusion region 660, the potential difference between positions 1012 and 1013 further increases, as illustrated by gradient potential energy 1025 with relative steeper slope.

The highest potential energy level of electrons in floating diffusion region 660 is potential energy level 1026. When floating diffusion region 660 is close to its electron-storage capacity i.e., filled with electric charges, the gradient potential energy 1024 with decreasing slope between positions 1012 and 1013 facilitates charge transfer and prevents electrons in diffusion region 660 from flowing back toward photodiode 640. This, when transfer gate 680 turns off electrons will continue to flow to floating diffusion region 660 because of decreasing gradient potential energy 1024 formed between the photodiode 640 and floating diffusion region 660 due to the created electric field between the pair of vertical transfer gate.

Figure 11:
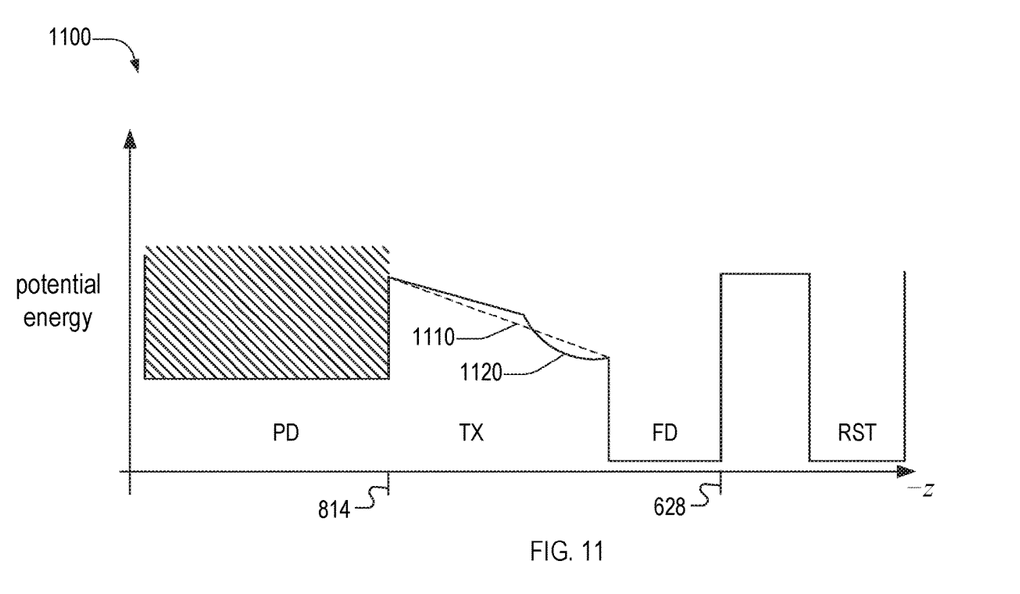
FIG. 11 is an energy band diagram illustrating potential energy transition within the pixel-array substrate of FIGS. 6-8, in an embodiment.

FIG. 11 is a potential energy diagram 1100 within semiconductor substrate 610 when gates 680 have a voltage applied thereto. Potential energy 1110 depicted is along a path in inter-trench plane 626 that traverses plane 814 and planar region 628 and includes both photodiode 640 and floating diffusion region 660. The slope of potential energy 1110 determines a magnitude of vertical electric fields 841 and 842 illustrated in FIG. 8 and is related to the distance between the trenches 931 and 932.

Potential energy diagram 1100 also includes potential energy 1120, within semiconductor substrate 910 when transfer gates 680 have a voltage applied thereto. Potential energy 1120 is along the same path as potential energy 1110. Potential energy 1120 includes a non-linear region resulting from concave regions 923 and 926. Potential energy 1120 is related to a magnitude of vertical electric fields 941 and 942 and horizontal electric field created between vertical transfer gates toward floating diffusion region 660 illustrated in FIG. 9.

Figure 12:
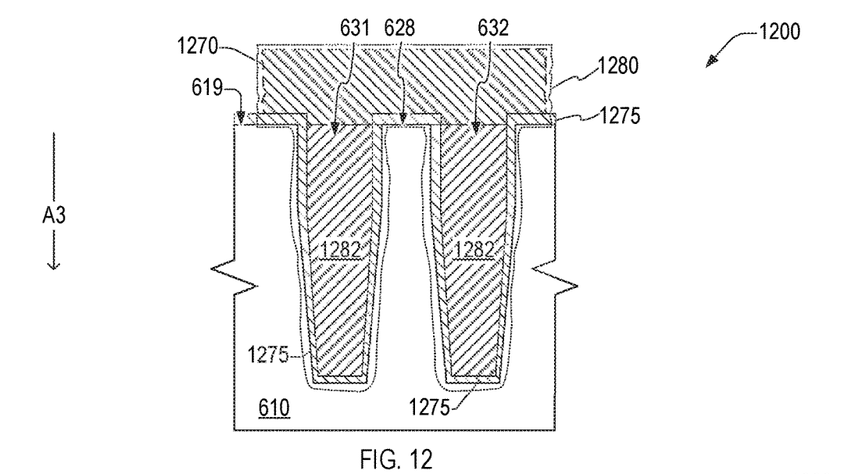
FIG. 12 is a cross-sectional schematic of a pixel-array substrate, which is an example of the pixel-array substrate of FIGS. 6-8.

FIG. 12 is a cross-sectional schematic of a pixel-array substrate 1200, which is an example of pixel-array substrate 600. The cross-sectional schematic of FIG. 12 is in a plane parallel to the x-z plane. Pixel-array substrate 1200 includes a semiconductor substrate 610 and trenches 631 and 632. Pixel-array substrate 1200 also includes, filling trench 631 and 632, a respective vertical gate-electrode 1282. In embodiments, pixel-array substrate 1200 includes a planar gate-electrode 1270 formed on top surface 619 of semiconductor substrate 610. Planar gate-electrode 1270 is electrically connected to vertical gates-electrodes 1282 extended from planar gate-electrode 1270 into trenches 631 and 632, respectively. In embodiments, planar gate-electrode 1270 is formed of a conductive material such as polysilicon, a metal, or a combination thereof. Vertical gate electrodes 1282 may be integrally formed with planar gate electrode 1270.

In embodiments, pixel-array substrate 1200 includes a vertical transfer gate 1280, which includes planar gate-electrode 1270, vertical gate-electrodes 1282 and an oxide layer 1275. Vertical transfer gate 1280 is electrically connected to photodiode 640, is an example of vertical transfer gate 280, FIG. 2. Oxide layer 1275 lines both side trench-surface 622 and bottom trench-surface 624 such that oxide layer 1275 is between gate-electrode 1282 and semiconductor substrate 610. Oxide layer 1275 may further extended onto the top surface of semiconductor substrate 610. In embodiments, the thickness of oxide layer 1275 is between 30 Å and 120 Å.

Figure 13:
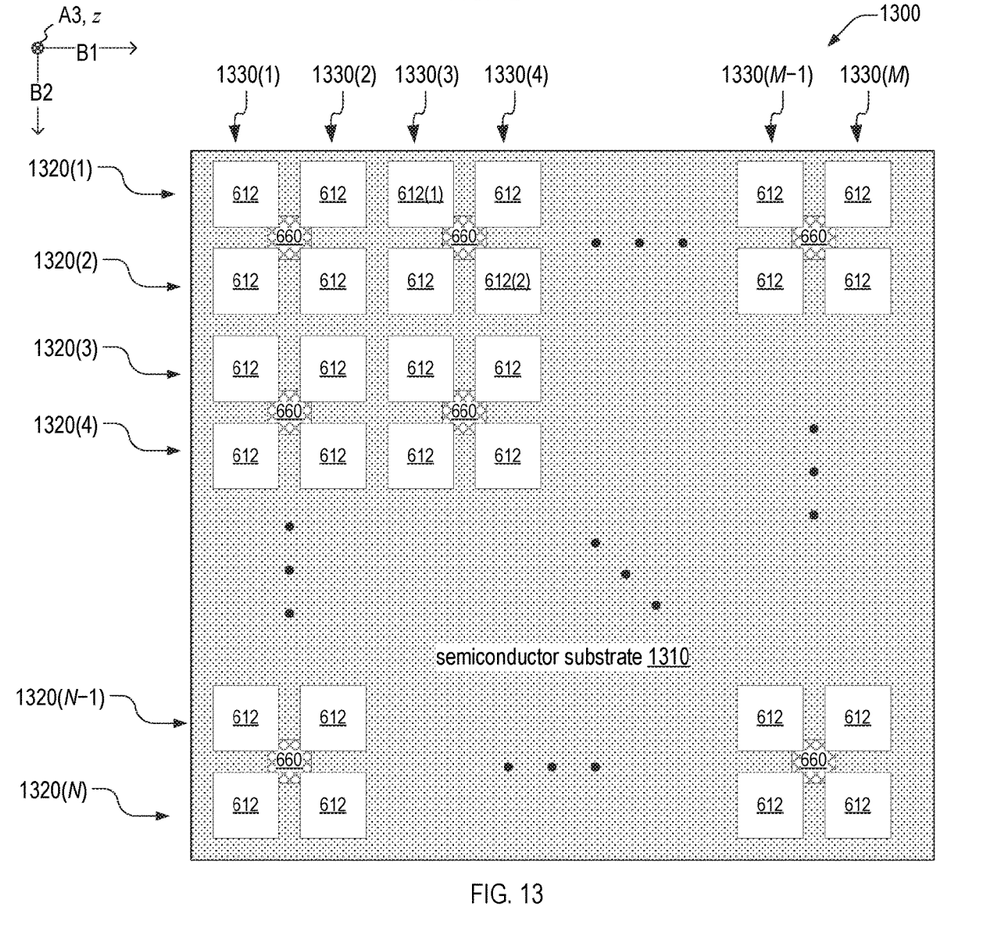
FIG. 13 is a schematic plan view of a pixel-array substrate, which is an example of the pixel-array substrate of FIGS. 6-8.

FIG. 13 is a schematic plan view of a pixel-array substrate 1300, which is an example of pixel-array substrate 600. Pixel-array substrate 1300 includes a plurality of rows 1320(1-N) of pixels 612 and a plurality of columns 1330(1-M) of pixels 612, where N and M are positive integers. Each pixel 612 is formed in a semiconductor substrate 1310, which is an example of semiconductor substrate 610. Pixel-array substrate 1300 includes a plurality of floating diffusion regions 660, each one of which is shared by, and part of each of four pixels 612 that form a two-by-two array. Rows 1320 and columns 1330 form a two-dimensional M×N array of photodiodes in a detection plane parallel to a horizontal plane. In embodiments, the detection plane is parallel to a backside surface or a light incident surface of the semiconductor substrate 1310. Pixel 612(1) is in row $1320(n_1)$ and a column $1330(m_1)$ of the plurality of columns. Integers $n_1$ and $m_1$ are less than or equal to N and M, respectively. Pixel 612(2) is in an adjacent row $1320(n_1 \pm 1)$ and in an adjacent column $1330(m_1 \pm 1)$. FIG. 13 illustrates an example in which $n_1=1$ and $m_1=3$.

Combinations of Features

Features described above, as well as those claimed below, may be combined in various ways without departing from the scope hereof. The following enumerated examples illustrate some possible, non-limiting combinations:

(A1) A pixel-array substrate includes a floating diffusion region and a first photodiode formed in a semiconductor substrate. A top surface of the semiconductor substrate defines a trench 1A and a trench 1B each (i) extending into the semiconductor substrate away from a planar region of the top surface between the trench 1A and the trench 1B and (ii) having a respective distal end, with respect to the floating diffusion region, located between the floating diffusion region and the first photodiode. In a horizontal plane parallel to the top surface and along an inter-trench direction between the trench 1A and the trench 1B, a first spatial separation between the trench 1A and the trench 1B increases with increasing distance from the floating diffusion region.

(A2) In embodiments of pixel-array substrate (A1), each of the trench 1A and the trench 1B has a respective proximal end, with respect to the floating diffusion region, located between the floating diffusion region and the first photodiode.

(A3) In embodiments of pixel-array substrate (A1), each of the trench 1A and the trench 1B has a respective proximal end, with respect to the floating diffusion region, located in the floating diffusion region.

(A4) In embodiments of any of pixel-array substrates (A1)-(A3), in the horizontal plane, the trench 1A is oblong in a first direction that intersects the floating diffusion region and the trench 1B is oblong in a second direction that intersects the floating diffusion region and is not parallel to the first direction.

(A5) In embodiments of any one of pixel-array substrates (A1)-(A4), in the horizontal plane, the spatial separation ranges from (i) 0.03 micrometers to 0.10 micrometers closest to the floating diffusion region and (ii) 0.12 micrometers to 0.30 micrometers furthest from the floating diffusion region.

(A6) In embodiments of any one of pixel-array substrates (A1)-(A5), in the horizontal plane, each of the trench 1A and the trench 1B extending into the floating diffusion region and surrounded by the floating diffusion region.

(A7) In embodiments of any one of pixel-array substrates (A1)-(A6), in a vertical plane perpendicular to the planar region and including the trench 1A and the trench 1B, a distance between the trench 1A and the trench 1B increases with increasing distance from the planar region.

(A8) In embodiments of any one of pixel-array substrates (A1)-(A7), the top surface including a first sidewall region defining an inner sidewall of the trench 1A. The inner sidewall includes a concave section in a vertical plane perpendicular to the planar region. In embodiments, a junction depth of floating diffusion region exceeds one-half a maximum depth of the concave section with respect to the planar region.

(A9) In embodiments of any one of pixel-array substrates (A1)-(A8), the trench 1A and the trench 1B being mirror-symmetric about a first vertical plane perpendicular to the top surface and intersecting the floating diffusion region.

(A10) In embodiments of any one of pixel-array substrates (A1)-(A9), each of the trench 1A and the trench 1B has a depth between 0.3 micrometers and 0.5 micrometers with respect to the planar region.

(A11) Embodiments of any one of pixel-array substrates (A1)-(A10) further include, when the top surface includes a side trench-surface and a bottom trench-surface that define the trench 1A, a gate-electrode 1A filling the trench 1A and a first oxide layer. The first oxide layer lining both the side trench-surface and the bottom trench-surface such that the first oxide layer is between the gate-electrode 1A and the semiconductor substrate. The first oxide layer and the gate-electrode 1A form a first vertical transfer gate electrically connected to the first photodiode.

(A12) Embodiments pixel-array substrate (A11) further includes, the top surface including a second side trench-surface and a second bottom trench-surface that define the trench 1B, a gate-electrode 1B filling the trench 1B and a second oxide layer lining both the second side trench-surface and the second bottom trench-surface such that the second oxide layer is between the gate-electrode 1B and the semiconductor substrate. The second oxide layer and the gate-electrode 1B form a second vertical transfer gate electrically connected to (i) the first photodiode and (ii) the first vertical transfer gate through a planar transfer gate disposed on the top surface of the semiconductor substrate. In embodiments, at least a part of the first vertical transfer gate and at least part of the second vertical transfer gate are surrounded by floating diffusion region.

(A13) Embodiments of any one of pixel-array substrates (A1)-(A12) further include a second photodiode formed in the semiconductor substrate. The floating diffusion region is located between the first photodiode and the second photodiode. The top surface of the semiconductor substrate defines a trench 2A and a trench 2B each (i) extending into the semiconductor substrate away from a second planar region of the top surface between the trench 2A and the trench 2B and (ii) having a respective distal end, with respect to the floating diffusion region, located between the floating diffusion region and the second photodiode. In the horizontal plane and along the inter-trench direction, a second spatial separation between the trench 2A and the trench 2B increases with increasing distance from the floating diffusion region.

(A14) In embodiments of pixel-array substrate (A13), the trench 1A and the trench 1B are mirror-symmetric about a first vertical plane perpendicular to the top surface and intersecting the floating diffusion region. The trench 2A and the trench 2B are mirror-symmetric about the first vertical plane.

(A15) Embodiments of any one of pixel-array substrates (A13) and (A14) further include a plurality of rows of photodiodes and a plurality of columns of photodiodes forming a two-dimensional array of photodiodes in a detection plane parallel to the horizontal plane. The first photodiode is in a first row of the plurality of rows and a first column of the plurality of columns. The second photodiode being in a second row of the plurality of rows, adjacent to the first row, and a second column of the plurality of columns that is adjacent to the first column.

(A16) Embodiments of pixel-array substrate (A15) further include a third photodiode formed in the semiconductor substrate and located in the first row and the second column. The top surface of the semiconductor substrate defines a third lower trench and a third upper trench each (i) extending into the semiconductor substrate away from a third planar region of the top surface between the third lower trench and the third upper trench and (ii) having a respective distal end, with respect to the floating diffusion region, located between the floating diffusion region and the third photodiode. In the horizontal plane and along a second inter-trench direction, a third spatial separation between the third lower trench and the third upper trench increases with increasing distance from the floating diffusion region.

(A17) In embodiments of pixel-array substrate (A16), the third lower trench and the third upper trench are mirror-symmetric about a second vertical plane perpendicular to the top surface and intersecting the floating diffusion region.

(A18) Embodiments of any one of pixel-array substrates (A16) and (A17) further include a fourth photodiode formed in the semiconductor substrate and located in the second row and the first column. The top surface of the semiconductor substrate defines a fourth lower trench and a fourth upper trench each (i) extending into the semiconductor substrate away from a fourth planar region of the top surface between the fourth lower trench and the fourth upper trench and (ii) having a respective distal end, with respect to the floating diffusion region, located between the floating diffusion region and the fourth photodiode. In the horizontal plane and along the second inter-trench direction, a fourth spatial separation between the fourth lower trench and the fourth upper trench increases with increasing distance from the floating diffusion region.

(A19) In embodiments of pixel-array substrate (A18), the third lower trench and the third upper trench being mirror-symmetric about a second vertical plane perpendicular to the top surface and intersecting the floating diffusion region. The fourth lower trench and the fourth upper trench are mirror-symmetric about the second vertical plane.

(A20) In embodiments of any one of pixel-array substrates (A1)-(A19), in the horizontal plane, an angle between the trench 1A and the trench 1B is between ten degrees and thirty degrees.

(B1) A pixel cell of a pixel array in an image sensor includes a plurality of photodiodes formed in a semiconductor substrate, a floating diffusion region formed in the semiconductor substrate, and a plurality of transfer gates. Each of the plurality of transfer gates (i) is located on a surface of the semiconductor substrate and, (ii) couples a respective one of the plurality of photodiodes to the floating diffusion region, and (iii) includes a planar gate, a first vertical gate, and a second vertical gate not parallel to the first vertical gate in a plane parallel to the surface. Each of the first vertical gate and the second vertical gate extends from the planar gate into the semiconductor substrate. The first vertical gate and the second vertical gate are proximate to the respective one of the plurality of photodiodes.

(B2) In embodiments of pixel cell (B1), a spacing between the first vertical gate and the second vertical gate decreases with increasing distance from the respective photodiode toward the floating diffusion region.

(B3) In embodiments of either one of pixel cell (B1) and (B2), each of the first vertical gate and the second vertical gate of the transfer gate has (i) a respective proximal end, with respect to the floating diffusion region, located between the floating diffusion region and the respective photodiode, and (ii) a respective distal end, with respect to the floating diffusion region, located proximate to the respective photodiode. The spacing between the respective distal ends of the first vertical gate and the second vertical gate is greater than the spacing between the respective proximal ends of the first vertical gate and the second vertical gate.

(B4) In embodiments of pixel cell (B3), the respective proximal ends of the first vertical gate and the second vertical gate of the transfer gate are located in the floating diffusion region, and at least a part of the first vertical gate and the second vertical gate are surrounded by the floating diffusion region.

(B5) In embodiments of any one of pixel cells (B1)-(B4), an angle in the plane between the first vertical gate and the second vertical gate being between ten degrees and thirty degrees (B6) In embodiments of any one of pixel cells (B1)-(B5), in a vertical plane perpendicular to the surface, a distance between the first vertical gate and the second vertical gate increasing with increasing distance from the surface.

Changes may be made in the above methods and systems without departing from the scope of the present embodiments. It should thus be noted that the matter contained in the above description or shown in the accompanying drawings should be interpreted as illustrative and not in a limiting sense. Herein, and unless otherwise indicated the phrase "in embodiments" is equivalent to the phrase "in certain embodiments," and does not refer to all embodiments. The following claims are intended to cover all generic and specific features described herein, as well as all statements of the scope of the present method and system, which, as a matter of language, might be said to fall therebetween.

What is claimed is:

1. A pixel-array substrate comprising:
   a floating diffusion region formed in a semiconductor substrate;
   a first photodiode formed in the semiconductor substrate; and
   a top surface of the semiconductor substrate defining a trench 1A and a trench 1B each (i) extending into the semiconductor substrate away from a planar region of the top surface between the trench 1A and the trench 1B and (ii) having a respective distal end, with respect to the floating diffusion region, located between the floating diffusion region and the first photodiode,
   in a horizontal plane parallel to the top surface and along an inter-trench direction between the trench 1A and the trench 1B, a first spatial separation between the trench 1A and the trench 1B increasing with increasing distance from the floating diffusion region.

2. The pixel-array substrate of claim 1, each of the trench 1A and the trench 1B having a respective proximal end, with respect to the floating diffusion region, located between the floating diffusion region and the first photodiode.

3. The pixel-array substrate of claim 1, each of the trench 1A and the trench 1B having a respective proximal end, with respect to the floating diffusion region, located in the floating diffusion region.

4. The pixel-array substrate of claim 1, in the horizontal plane,
   the trench 1A being oblong in a first direction that intersects the floating diffusion region; and
   the trench 1B being oblong in a second direction that intersects the floating diffusion region and is not parallel to the first direction.

5. The pixel-array substrate of claim 1, in the horizontal plane, each of the trench 1A and the trench 1B extending into the floating diffusion region and surrounded by the floating diffusion region.

6. The pixel-array substrate of claim 1, in a vertical plane perpendicular to the planar region and including the trench 1A and the trench 1B, a distance between the trench 1A and the trench 1B increasing with increasing distance from the planar region.

7. The pixel-array substrate of claim 1, the top surface including a first sidewall region defining an inner sidewall of the trench 1A, the inner sidewall including a concave section in a vertical plane perpendicular to the planar region.

8. The pixel-array substrate of claim 7, a junction depth of the floating diffusion region exceeding one-half a maximum depth of the concave section with respect to the planar region.

9. The pixel-array substrate of claim 1, the trench 1A and the trench 1B being mirror-symmetric about a first vertical plane perpendicular to the top surface and intersecting the floating diffusion region.

10. The pixel-array substrate of claim 1, in the horizontal plane, an angle between the trench 1A and the trench 1B being between ten degrees and thirty degrees.

11. The pixel-array substrate of claim 1, the top surface including a side trench-surface and a bottom trench-surface that define the trench 1A, and the pixel-array substrate further comprising:
 a gate-electrode 1A filling the trench 1A; and
 a first oxide layer lining both the side trench-surface and the bottom trench-surface such that the first oxide layer is between the gate-electrode 1A and the semiconductor substrate;
 the first oxide layer and the gate-electrode 1A forming a first vertical transfer gate electrically connected to the first photodiode.

12. The pixel-array substrate of claim 11, the top surface including a second side trench-surface and a second bottom trench-surface that define the trench 1B, and the pixel-array substrate further comprising:
 a gate-electrode 1B filling the trench 1B; and
 a second oxide layer lining both the second side trench-surface and the second bottom trench-surface such that the second oxide layer is between the gate-electrode 1B and the semiconductor substrate,
 the second oxide layer and the gate-electrode 1B forming a second vertical transfer gate electrically connected to (i) the first photodiode and (ii) the first vertical transfer gate through a planar transfer gate disposed on the top surface of the semiconductor substrate.

13. The pixel-array substrate of claim 12, wherein at least a part of the first vertical transfer gate and at least a part of the second vertical transfer gate are surrounded by the floating diffusion region.

14. The pixel-array substrate of claim 1, further comprising:
 a second photodiode formed in the semiconductor substrate, the floating diffusion region being located between the first photodiode and the second photodiode,
 the top surface of the semiconductor substrate defining a trench 2A and a trench 2B each (i) extending into the semiconductor substrate away from a second planar region of the top surface between the trench 2A and the trench 2B and (ii) having a respective distal end, with respect to the floating diffusion region, located between the floating diffusion region and the second photodiode;
 in the horizontal plane and along the inter-trench direction, a second spatial separation between the trench 2A and the trench 2B increasing with increasing distance from the floating diffusion region.

15. The pixel-array substrate of claim 14,
 the trench 1A and the trench 1B being mirror-symmetric about a first vertical plane perpendicular to the top surface and intersecting the floating diffusion region; and
 the trench 2A and the trench 2B being mirror-symmetric about the first vertical plane.

16. The pixel-array substrate of claim 14, further comprising:
 a plurality of rows of photodiodes and a plurality of columns of photodiodes forming a two-dimensional array of photodiodes in a detection plane parallel to the horizontal plane,
 the first photodiode being in a first row of the plurality of rows and a first column of the plurality of columns, the second photodiode being in a second row of the plurality of rows, adjacent to the first row, and a second column of the plurality of columns that is adjacent to the first column.

17. A pixel cell of a pixel array in an image sensor comprising:
 a plurality of photodiodes formed in a semiconductor substrate;
 a floating diffusion region formed in the semiconductor substrate; and
 a plurality of transfer gates each (i) located on a surface of the semiconductor substrate and, (ii) coupling a respective one of the plurality of photodiodes to the floating diffusion region, and (iii) including a planar gate, a first vertical gate, and a second vertical gate not parallel to the first vertical gate in a plane parallel to the surface, each of the first vertical gate and the second vertical gate extending from the planar gate into the semiconductor substrate, the first vertical gate and the second vertical gate being proximate to the respective one of the plurality of photodiodes.

18. The pixel cell of claim 17, wherein each of the first vertical gate and the second vertical gate of the transfer gate has (i) a respective proximal end, with respect to the floating diffusion region, located between the floating diffusion region and the respective photodiode, and (ii) a respective distal end, with respect to the floating diffusion region, located proximate to the respective photodiode; wherein a spacing between the respective distal ends of the first vertical gate and the second vertical gate is greater than a spacing between the respective proximal ends of the first vertical gate and the second vertical gate.

19. The pixel cell of claim 18 wherein the respective proximal ends of the first vertical gate and the second vertical gate of the transfer gate are located in the floating diffusion region, and at least a part of the first vertical gate and the second vertical gate are surrounded by the floating diffusion region.

20. The pixel cell of claim 17, wherein a spacing in the plane between the first vertical gate and the second vertical gate decreases with increasing distance from the respective photodiode toward the floating diffusion region.

21. The pixel cell of claim 17, an angle in the plane between the first vertical gate and the second vertical gate being between ten degrees and thirty degrees.

22. The pixel cell of claim 17, in a vertical plane perpendicular to the surface, a distance between the first vertical gate and the second vertical gate increasing with increasing distance from the surface.

* * * * *